United States Patent
Cole

(10) Patent No.: US 7,202,098 B2
(45) Date of Patent: Apr. 10, 2007

(54) METHOD AND STRUCTURE TO REDUCE OPTICAL CROSSTALK IN A SOLID STATE IMAGER

(75) Inventor: Bryan G. Cole, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/439,965

(22) Filed: May 25, 2006

(65) Prior Publication Data

US 2006/0208330 A1 Sep. 21, 2006

Related U.S. Application Data

(62) Division of application No. 11/072,456, filed on Mar. 7, 2005.

(51) Int. Cl.
*H01L 21/00* (2006.01)

(52) U.S. Cl. ............................................. 438/30; 34/69

(58) Field of Classification Search ............ 438/30–48, 438/69–90
See application file for complete search history.

(56) References Cited

U.S. PATENT DOCUMENTS

| 6,333,205 B1 | 12/2001 | Rhodes |
| 6,611,013 B2 | 8/2003 | Rhodes |
| 6,803,614 B2 * | 10/2004 | Takahashi .................. 257/440 |

* cited by examiner

*Primary Examiner*—Cuong Nguyen
(74) *Attorney, Agent, or Firm*—Dickstein Shapiro LLP

(57) ABSTRACT

Methods and structures to reduce optical crosstalk in solid state imager arrays. Sections of pixel material layers that previously would have been etched away and disposed of as waste during fabrication are left as conserved sections. These conserved sections are used to amend the properties and performance of the imager array. In the resulting structure, the conserved sections absorb incident light. The patterned portions of conserved material provide additional light shielding for array pixels.

7 Claims, 9 Drawing Sheets

METHOD AND STRUCTURE TO REDUCE OPTICAL CROSSTALK IN A SOLID STATE IMAGER

CROSS REFERENCE TO RELATED APPLICATIONS

The present application is a divisional of U.S. patent application Ser. No. 11/072,456, filed on Mar. 7, 2005, the disclosure of which is incorporated by reference in its entirety.

FIELD OF THE INVENTION

This invention generally relates to electronic systems and in particular it relates to semiconductor image sensing devices.

BACKGROUND OF THE INVENTION

Optical crosstalk may exist between neighboring photosensors in a pixel array of a solid state imager, such as a CCD or CMOS imager, for example. Optical crosstalk in imagers can bring about undesirable results in images that they produce. The undesirable results can become more pronounced as the density of pixels in imager arrays increases, and as pixel size correspondingly decreases.

In an idealized photosensor, a photodiode for example, light enters only through the surface of the photodiode that directly receives the light stimulus. In reality, however, light intended for neighboring photosensors also enters the photodiode, in the form of stray light, through the sides of the photosensor structure for example. Reflection and refraction within the photosensor structure can give rise to the stray light, which is referred to as "optical crosstalk."

Optical crosstalk can manifest as blurring or reduction in contrast, for example, in images produced by a solid state imager. As noted above, image degradation can become more pronounced as pixel and device sizes are reduced. Degradation caused by optical crosstalk also is more conspicuous at longer wavelengths of light. Light at longer wavelengths penetrates more deeply into the silicon structure of a pixel, providing more opportunities for the light to be reflected or refracted away from its intended photosensor target.

Problems associated with optical crosstalk have been addressed by adding light shields to imager structures. The light shields are formed in layers fabricated above the admitting surface through which the photosensor directly receives light stimulus. The light shield layers generally include metal and other opaque materials. The added layers of light shields, however, increase the size, complexity, and cost of imagers and imager fabrication.

The added light shields generally are formed as part of the uppermost layers of the imager array. Light shields have been formed, for example, in metal interconnect layers (e.g., Metal 1, Metal 2, or, if utilized, Metal 3 layers) of the photosensor's integrated circuitry. Light shields formed in such upper fabrication layers have inherent drawbacks, however. For example, metallization layers dedicated to light shielding are limited in their normal use as conductive connections for the imager array. Additionally, light shields formed in upper device layers are separated from the light-admitting surface of the photosensor by several light transmitting layers. Moreover, the light shields are imperfect, and allow some light to pass into the light transmitting layers. Consequently, optical crosstalk still occurs through the light transmitting layers between the photosensor and the light shields. Having the light shields spaced apart from the surface of the photosensor also can increase light piping and light shadowing in the photosensors, leading to further errors in imager function.

Methods and structures related to light shielding in CMOS imagers are disclosed in U.S. Pat. No. 6,611,013 to Rhodes, and U.S. Pat. No. 6,333,205, also to Rhodes. The Rhodes '013 and '205 patents are incorporated herein by reference in their entirety.

Solid state imagers would benefit from more efficient and effective light shields. Of particular benefit would be light shields that make more efficient use of existing fabrication layers to better preclude optical crosstalk.

BRIEF SUMMARY OF THE INVENTION

The present invention in various exemplary embodiments provides fabrication methods and resulting pixel array structures in which individual fabrication layers normally discarded in pixel fabrication are patterned into sections that can serve light shield or collection purposes.

In one exemplary embodiment, a fabrication layer includes polysilicon patterned to develop transistor gate structures as part of a pixel circuit in a first section (referred to as a "circuit section"). Structures designed to physically augment light shielding or light collecting capabilities of the pixel are formed in a second section (referred to as a "conserved section") of the fabrication layer. The conserved section previously was etched away during imager fabrication as unusable waste. According to exemplary embodiments of the present invention, the conserved section instead is retained and used to augment the pixel structure and function. For example, the conserved section can be used to enhance light shielding or for light collection.

According to an embodiment exemplary of the invention, at least one polysilicon layer is patterned into a pixel gate or pixel interconnect circuit section and a conserved section. The gate circuit section is developed for discrete transistor gate fabrication while the interconnect circuit section may be used to interconnect electrical elements of the pixel. The conserved section is left undisturbed, instead of being etched away, and is used as a light shield or for light collection.

Advantageously, if the conserved section of the polysilicon layer used for light shielding, it is located adjacent an energy-admitting face of the photosensor. The close proximity of the light shields formed by the conserved sections of the polysilicon layer prevent scattering of light to neighboring pixels. The light shields thus formed make economical and valuable use of material previously considered waste. The conserved section, of the polysilicon layer for example, may also be used for light collection purposes. The conserved sections of an existing layer can be used to replace or augment the functions of other layers, which other layers accordingly can be removed or made thinner, resulting in a more compact pixel construction.

BRIEF DESCRIPTION OF THE DRAWINGS

The above and other advantages and features of the invention will be more clearly understood from the following detailed description which is provided in connection with the accompanying drawings.

DETAILED DESCRIPTION OF THE INVENTION

Figure 1:
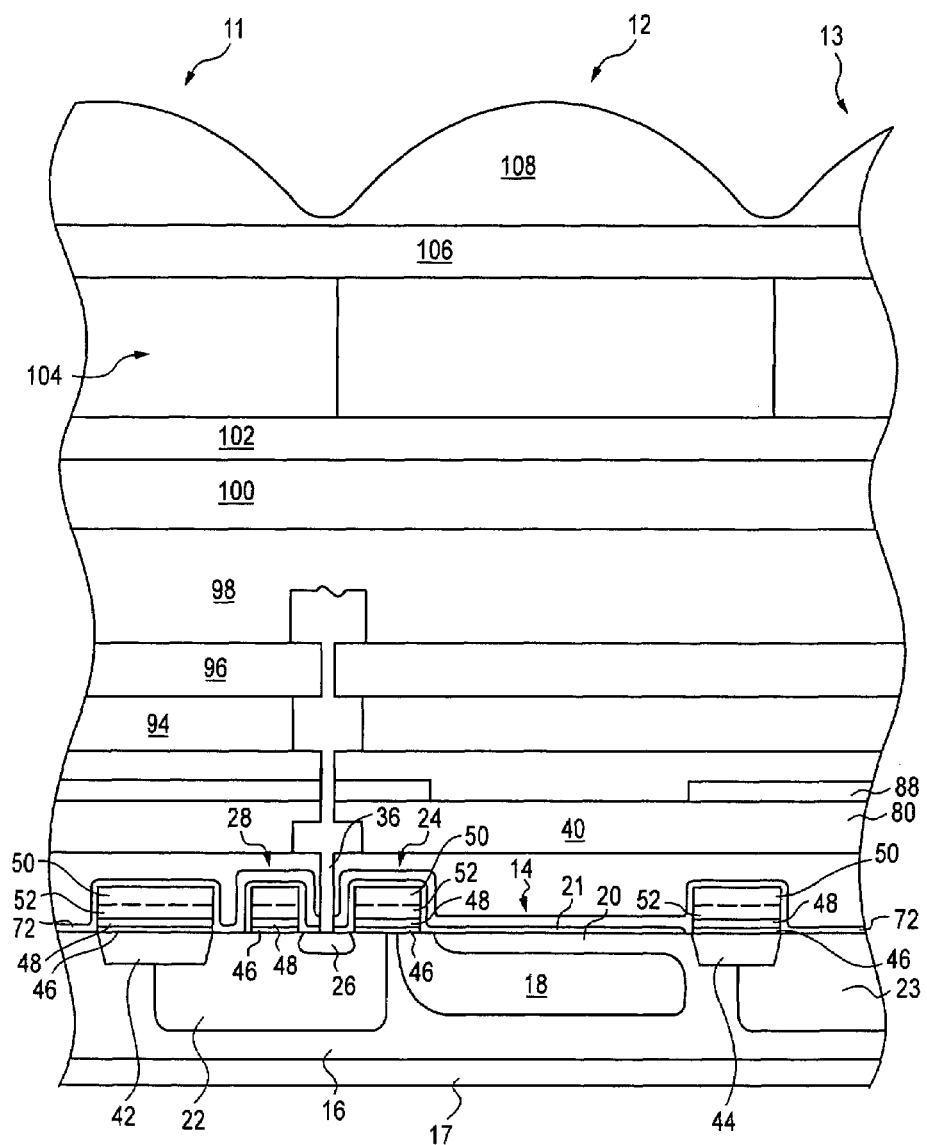
FIG. 1 illustrates in elevation a cross section, taken along the line I—I in FIG. 3, of a portion of an imager array according to an exemplary embodiment of the present invention.

In the following detailed description, reference is made to the accompanying drawings which form a part hereof and illustrate specific exemplary embodiments by which the invention may be practiced. It should be understood that like reference numerals represent like elements throughout the drawings. These embodiments are described in sufficient detail to enable those skilled in the art to practice the invention. It is to be understood that other embodiments may be utilized, and that structural, logical, and electrical changes may be made without departing from the spirit and scope of the present invention.

The term "substrate" is to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in the base semiconductor structure or foundation. In addition, the semiconductor need not be silicon-based, but could be based on silicon-germanium, germanium, or gallium arsenide, for example.

The term "light" refers to electromagnetic radiation that can produce a visual sensation (visible light) as well as electromagnetic radiation outside of the visible spectrum. In general, light as used herein is not limited to visible radiation, but refers more broadly to the entire electromagnetic spectrum, particularly electromagnetic radiation that can be transduced by a solid state photosensor into a useful electrical signal.

The term "pixel" refers to a picture element unit containing circuitry including a photosensor and transistors for converting incident electromagnetic radiation to an electrical signal. For purposes of illustration, representative pixels are illustrated in the drawings and description herein. Typically fabrication of all pixels in an imager will proceed simultaneously in a similar fashion. The following detailed description is, therefore, not to be taken in a limiting sense, and the scope of the present invention is defined by the appended claims.

The term "layer" refers to both a single layer and multiple layers, or strata. The term 'layer' can be understood to refer to a structure that includes multiple layers. Typically, similar fabrication steps and processes, such as patterning and etching, are applied to all layers in the structure. Adjacent layers can be patterned and etched simultaneously.

The present invention provides an imaging device formed in an exemplary embodiment as a CMOS integrated circuit using standard CMOS fabrication processes. The exemplary embodiment provides fabrication methods and resulting pixel array structures in which individual fabrication layers are patterned into sections serving assorted purposes. For example, a polysilicon layer traditionally is patterned to develop transistor gate structures for pixel circuitry. Sections of the polysilicon layer not used as transistor gate structures, formerly discarded as unusable, are instead conserved for light shielding or light collecting, for example. Sections of other fabrication layers, besides transistor gate polysilicon layers, can be similarly conserved and used for light shielding. A gate oxide layer formed beneath and coextensively with the polysilicon layer can be patterned simultaneously with the polysilicon layer to provide additional light shielding or collecting capabilities.

In some pixel architectures the polysilicon layer may also be used as a buried contact to reduce the vertical distance a metal contact must travel. In such arrangements, the conserved sections include areas of the polysilicon layer not used for gates or interconnect structures. These conserved sections can be used as light shields or light collectors.

In some pixel architectures the polysilicon layer or metallic layers may also be used as a local interconnect to interconnect pixel components. In such arrangements, the conserved sections include areas of the polysilicon layer and metallic layers not used for gates or interconnect structures. These conserved sections can be used as light shields or light collectors.

In yet other pixel architectures an upper polysilicon layer, above the polysilicon gate layer, may be used to form upper electrodes of a capacitor for a pixel. In such arrangements, the upper polysilicon layer may also be patterned to have conserved sections which are not used for the capacitor electrode and may act as light shields or for collecting light.

In the exemplary embodiments described below, the invention is discussed in the context of patterning a polysilicon layer and associated oxide layer into a gate circuit section for the pixel and into a conserved section which is not used for gate or interconnected functions and which can be used as a light shield or for light gathering functions.

However, it should be understood that other fabrication layers close to the substrate surface, such as the capacitor electrode polysilicon layer discussed above or any polysilicon layers used for buried contacts or local interconnects, may also be patterned to yield conserved sections which can be used for light shielding or light gathering purposes.

Referring now to the polysilicon layer used for pixel gates, the polysilicon gate layer and the underlying gate oxide layer are provided over substantially the full extent of the substrate's major surface. Openings are provided in the polysilicon gate layer and the gate oxide layer to allow light to impinge upon an admitting face of the photosensor. The openings are formed typically by patterning and etching away layers formed over those sections required for physical development and electrical isolation of transistor gates and other device components, as described below. The polysilicon layer and the coextensive gate oxide layer are configured to closely border outer margins of pixel active areas to provide protection from photocontamination by off-axis light from neighboring pixels, for example, and thereby reduce optical crosstalk.

As a result of using the sections of the polysilicon gate layer to provide layer light shielding at a level closer to the admitting surface of the photocollector, other light-shielding structures, such as those provided in the upper fabrication layers, can be reduced in thickness, for example, or eliminated entirely. The conserved sections of the polysilicon gate layer, augmented by the gate oxide layer, may independently provide sufficient light shielding, in which case light-shielding structures provided in the upper layers above the photodiode surface are not necessary. The unnecessary layers can be eliminated or put to another purpose, such as circuit interconnection. As noted, the conserved sections may also be used for light gathering functions.

If sufficient light shielding is not provided by the retained conserved sections of the polysilicon gate layer and the gate oxide layer, for example, additional light shielding in upper device layers can continue to be employed. As a result of the added light-shielding capabilities provided by the lower layer light shields, however, the thickness and/or extent of the upper light-shielding layers can be reduced while retaining or improving upon the overall level of light shielding in the pixel. By reducing reliance on upper layer light-shields, and by using conserved sections of an existing layer that previously were discarded as having no useful function, fabrication processes can be simplified, and device sizes can be further reduced.

Further economies in fabrication can be realized by retaining the conserved sections of the polysilicon gate layer, for example. Leaving the conserved sections in place presents a more planar surface for subsequent deposition steps, as compared to a surface with the conserved sections of polysilicon removed. As a result, layers subsequently deposited can be smoother, even without polishing the polysilicon gate layer. Steps previously required to polish the polysilicon gate layer prior to subsequent deposition can be eliminated or reduced in duration. Concomitantly, the layers deposited over the polysilicon gate layer will be smoother, thereby eliminating or reducing the need for subsequent polishing steps.

Exemplary embodiments of the methods and apparatus aspects of the invention are described below in connection with CMOS imager circuitry and components. The circuit described below includes a photosensor formed as a photodiode, for accumulating photo-generated charge in an underlying portion of the substrate. It should be understood, however, that the imager may include a photogate, or any other image-to-charge converter or transducer, in lieu of a photodiode. The invention is not limited by the type of device used to accumulate or otherwise obtain photo-generated charge. It should also be noted that while an embodiment of the invention is described in relation to four-transistor (4T) pixels of a CMOS imager, the invention also has applicability to other pixel structures and to other types of solid state imagers that feature pixel arrays.

Referring more specifically to the drawings, FIG. 1 shows in cross-section a portion of CMOS pixel 12 and portions of adjacent pixels 11, 13 exemplifying an embodiment of the present invention. A schematic circuit representation of the pixel 12 is provided in FIG. 2. The circuit is shown as a four transistor (4T) pixel, though, as noted, the pixel may have any of several circuit configurations. Portions of the FIG. 2 circuit appear in the FIG. 1 cross section, including photodiode 14, transfer gate 24 (of transfer transistor 25), reset gate 28 (of reset transistor 30), and a floating diffusion node 26.

Figure 2:
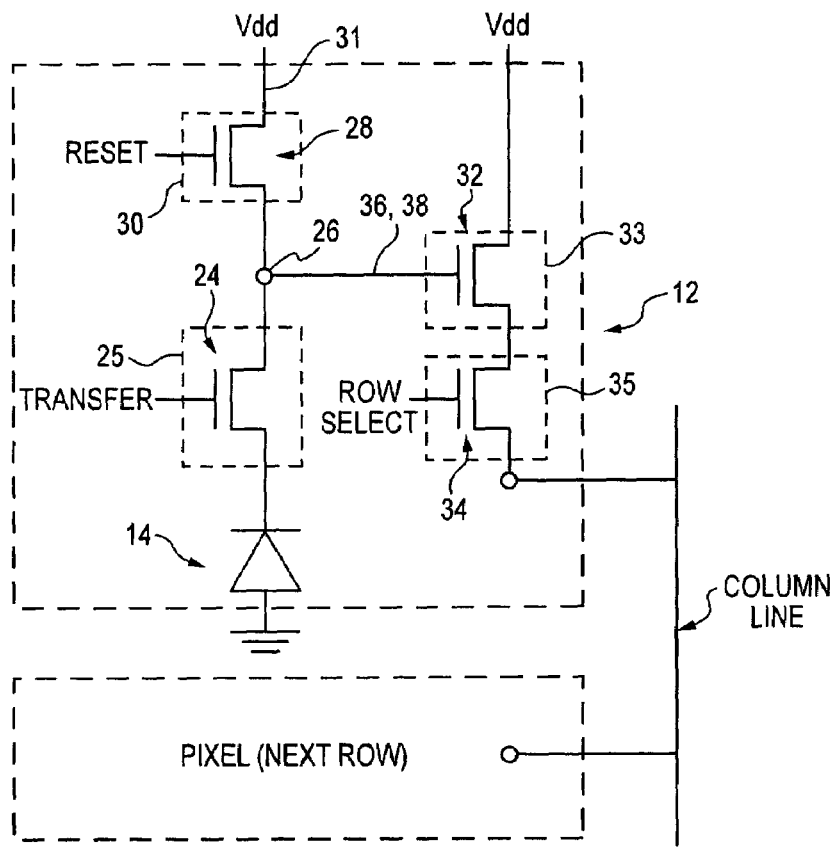
FIG. 2 is a circuit diagram of a pixel in the imager array of FIG. 1.
Figure 3:
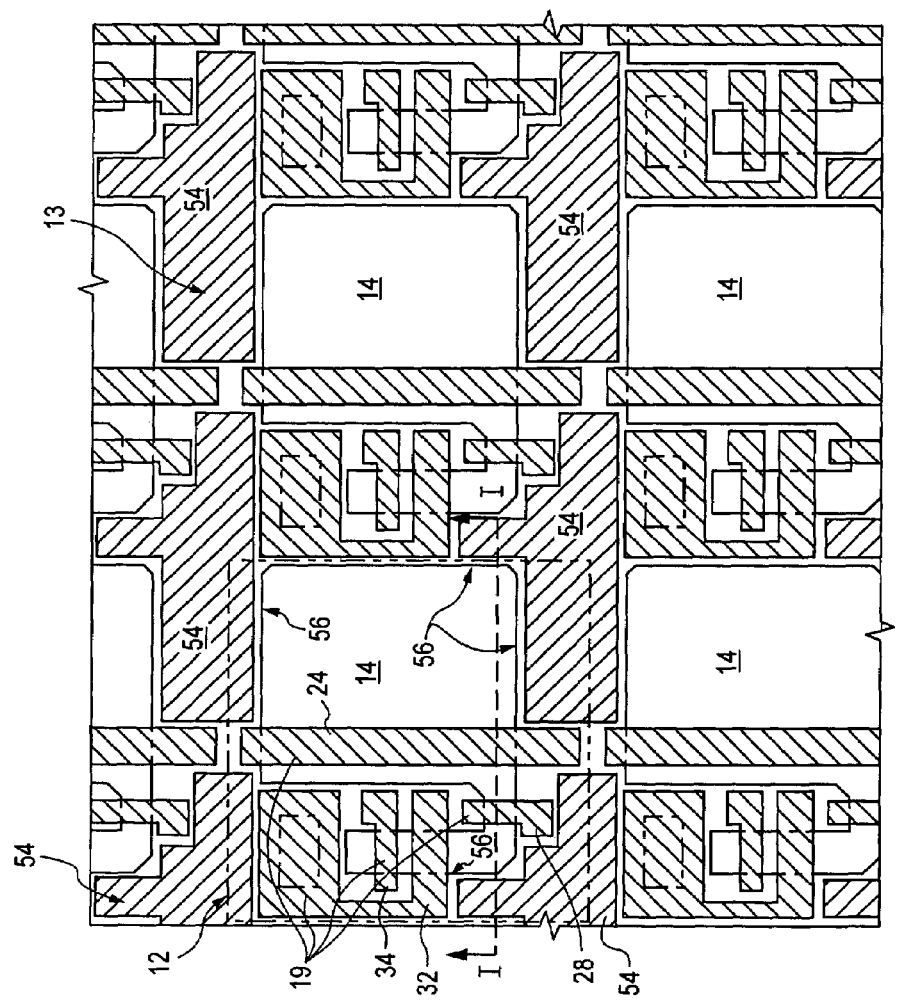
FIG. 3 is a plan view showing pixels arranged in a portion of a row and column imager array in an intermediate state of fabrication according to the exemplary embodiment.

FIG. 3 illustrates in plan view a section of the CMOS imager pixel array shown in FIGS. 1 and 2. FIG. 3 depicts the pixels 12, 13 and portions of neighboring pixels in the imager pixel array. It is understood that additional pixels not shown are arranged in row and column fashion to make up the entire imager pixel array.

The pixels are represented in FIG. 3 at an intermediate stage of fabrication according to an exemplary embodiment of the present invention. At this point of the fabrication process, described in greater detail below, a gate oxide layer 46 and a polysilicon layer 48 (shown in FIG. 1) have been patterned to provide light access to the admitting surface of photodiodes 14. The gate oxide layer 46 and the polysilicon layer 48 are patterned to form, for each photodiode 14, a transfer transistor gate 24, a reset transistor gate 28, a source follower gate 32 and a row select gate 34. (As with other structures, the gates for only one photodiode 14 are numbered to avoid crowding.) The patterning leaves in place conserved sections 54 of the gate oxide layer 46 and the polysilicon layer 48 for use as light shields, or for light gathering, likewise described in greater detail below.

Referring in greater detail to FIGS. 1–3, representative pixel 12 of the exemplary imager array includes the photodiode 14 formed by implantation in an epitaxial (EPI) p-type layer 16, which is over a p-type substrate 17. An n-type conductivity region 18 is provided in EPI layer 16 and accumulates photo-generated charge. An uppermost, thin p-type conductivity region 20 is provided over the n-type region 18. The pixel 12 further includes a doped p-well 22 defined in p-type layer 16. An identical p-well 23 is provided in layer 16 as part of pixel 13. Above a portion of p-well 22 and adjacent the photodiode 14 the transfer gate 24 is formed. The transfer gate 24 serves as part of the transfer transistor 25 (FIG. 2) for electrically gating charges accumulated by photodiode 14 to floating diffusion region 26 implanted in a portion of p-well 22.

The reset gate 28 is formed as part of the reset transistor 30 beside the transfer gate 24, illustrated schematically in FIG. 2. The reset transistor 30 is connected to a voltage source ($V_{dd}$) through a source/drain region having a conductor 31 (FIG. 2) providing a resetting voltage to the floating diffusion region 26. Also shown in FIG. 2 are the source follower gate 32 of source-follower transistor 33, and the row select gate 34 of row select transistor 35. The source follower gate 32 and the row select gate 34 are also depicted in FIG. 3.

A conductor 36 at the floating diffusion region 26 is in electrical communication with the source follower gate 32 of the source follower transistor 33 through another conductor 38 (FIG. 2). Conductor 38 routes through a conductive path in an interconnect layer 40 (e.g., the M1 layer). Lateral isolation between the adjacent pixels 11, 12 and 12, 13 is provided by shallow trench isolation (STI) regions 42, 44, respectively, illustrated in FIG. 1.

The gate oxide layer 46 and the polysilicon layer 48, introduced above with reference to FIG. 3, are formed on or near the upper surface of the layer 16. In an exemplary embodiment, the gate oxide layer 46 is deposited over the entire upper surface of the layer 16, followed by the polysilicon layer 48. The polysilicon layer 48 can be undoped, doped in situ, or subsequently implanted with a dopant, for example. An insulative capping layer 50 (made of, e.g., tetraethyl orthosilicate (TEOS), $Si(OC_2H_5)_4$, oxide, or nitride) is fabricated over the polysilicon layer 48. Formation of the insulative capping layer 50 can optionally be preceded in another exemplary embodiment by a silicide layer 52. These layers 46, 48, 50, (optional 52), are then masked with a patterned photoresist for etching.

Etching of the masked layers 46, 48, 50, (52) selectively removes unmasked portions and leaves in place a circuit section 19 (shown with right leaning cross hatching) of the masked layers including transfer gate 24, transfer transistor 25, reset gate 28, reset transistor 30, source-follower gate 32, source-follower transistor 33, row select gate 34, and row select transistor 35, respectively. Conserved sections 54 (shown in FIG. 3 with left leaning cross hatching) are masked and remain in place as well after etching. In the exemplary embodiment being described, the conserved sections 54 can be left passive and electrically isolated from all other circuitry by removal of additional unmasked sections of the layers 46, 48, 50, (52). Unmasked sections immediately above the admitting face of photodiode 14 also are removed to allow light to enter.

Each conserved section 54 is shown in FIG. 3 as covering a contiguous area, but the invention is not so limited. Additional areas, which may or may not be contiguous with conserved section 54, can be considered part of the conserved section 54 and act as light shields in similar fashion, taking into consideration manufacturing tolerances and requirements, and potential component and structural interactions, e.g., capacitance, inductance, etc.

Referring back to FIG. 1, the layers 46, 48, 50, (52), and others, are shown as being substantially planar. Further, although only optional silicide layer 52 has been indicated as part of an exemplary alternative construction, other layers can be added, such as nitride layers, or removed, by methods that provide devices included within the scope of the invention. In addition, it will be understood that FIG. 3 illustrates but one exemplary layout of an imager array in which the transfer gates are arranged on the page vertically with the array columns; however, other pixel layouts may also be used. As but one example, the imager array could include a 90°-rotated orientation, in which the transfer gates are arranged horizontally with the array rows, and a single, continuous transfer gate for each row could be used.

Referring once again to FIG. 3, the photoactive area of photodiode 14 has an outer margin or border 56. Shielding can be maximized by forming the polcysilicon layer and underlying oxide layer, for example, as close as possible to this border. Some light shielding is inherently supplied by the circuit section 19 containing portions of the transfer transistor gate 24, the reset transistor gate 28, and the row select gate 34 formed within the layers 46, 48, 50, (52). Considering photodiodes 14 as being in columns oriented vertically on the page containing FIG. 3, the associated circuit sections 19 are patterned to border adjacent the outer left side and right side margins 56 of the photodiodes 14. The circuit sections 19 thus provide light shielding to neighboring photodiodes 14. Thus, areas between photodiodes 14 and between other pixel pairs in each column of the imager array are provided with light shielding by the pixel circuitry.

Areas between adjacent photodiodes 14 in each row of photodiodes and circuit sections 19 of the array, as illustrated in FIG. 3, contain very few gates or other structures. As exemplified, these areas accordingly are covered by conserved sections 54 of layers 46, 48, 50, (52). In addition, conserved section 54 covers areas between adjacent gate areas of each pixel 12 left open by the circuit sections 19. Thus, circuit sections 19 and conserved sections 54 cover virtually all of the non-photoactive areas of each pixel 12.

In the exemplary embodiment shown in FIG. 3, the active area of photodiode 14 is substantially quadrangular, and layers 46, 48, 50, (52) bound on all four edges at least most portions of the outer border 56 of photodiode 14. The circuit sections 19 and conserved sections 54 combined provide light shielding over substantially all of each pixel's surface area not occupied by photodiode 14. Margin area gaps between the outer border 56 of photodiode 14 and the adjoining edges of layers 46, 48, 50, (52) are minimized within manufacturing tolerances to reduce the amount of stray light that can pass through the gaps and cause cross talk, while ensuring that shorting of active areas by polysilicon layer 48 does not reduce yield unacceptably. Portions of polysilicon layer 48 are removed from narrow areas between and adjacent at least some of the gates 24, 28, 32, 34 to prevent problems such as those related to shorting, for example.

Light shielding provided by the conserved sections 54 is due primarily to light absorption in polysilicon layer 48. The energy bandgap ($E_G$) of silicon is 1.11 eV at 300° K., or a wavelength ($\lambda_G$) of 1117.8 nm. Photons with a wavelength $\lambda$ less than $\lambda_G$ are absorbed by the electrons in the polysilicon lattice. Red light ($\lambda$=600–750 nm) penetrates the deepest before becoming absorbed. Green light ($\lambda$=500–600 nm) penetrates less, while blue light ($\lambda$=400–500 nm) is quickly absorbed. Polysilicon will absorb about five times more light than crystal silicon due to the surface roughness and higher absorption. Additional light shielding is exhibited by absorption in other layers of conserved sections 54, such as the optional silicide layer 52.

More generally, absorption is defined as the relative decrease of irradiance $\Phi$ per unit path length:

$$\delta\Phi(x)/\Phi = \alpha\delta x \qquad (1)$$

A solution to this equation is:

$$\Phi(x) = \Phi o e^{-\alpha x} \qquad (2)$$

where $\Phi o$ is the incident irradiance, a is the absorption coefficient, and x is path length.

The absorption coefficient of polysilicon was determined experimentally by Lubberts et al., "Optical Properties of Phosphorus-doped Polycrystalline Silicon Layers," J. Appl. Phys. 52, 6870–6878 (November 1981), results of which are shown in the following Table:

TABLE

| Wavelength (μm) | α undoped (×10E4 cm$^{-1}$) |
|---|---|
| 0.4 | 22.7 |
| 0.45 | 8.33 |
| 0.5 | 3.7 |
| 0.55 | 1.84 |
| 0.6 | 0.981 |

The results shown in the Table reveal that light of longer wavelengths (e.g., red colored light) will be absorbed less (i.e., have a lower absorption coefficient α) than light of longer wavelength (e.g., green colored and blue colored light) for layers of a given thickness. In addition, thicker layers absorb more light, with red, green, and blue being absorbed at different rates. Layer thickness can be used to control how much light of a certain color is filtered.

In an exemplary embodiment, polysilicon layer 48 has a thickness of about 850 Å, but can range from about 200 Å to about 3000 Å, for example. Most of the light shielding in the exemplary embodiments described above is provided by light absorption in the polysilicon layer 48. Additional absorption takes place in the gate oxide layer 46 and insulative capping layer 50. Light shielding also occurs at layer interfaces, e.g., interfaces between layer pairs 46, 48 and 48, 50.

Referring again to FIG. 2, the representative pixel 12 is operated as is known in the art by RESET, TRANSFER, and ROW SELECT control signals. As an example of an alternative exemplary circuit configuration, the 4T pixel 12 can be converted to a three transistor (3T) pixel by removal of the transfer transistor 25, and electrically coupling the photodiode 14 output to the floating diffusion region 26. Also, the floating diffusion region 26 is connected to the source follower gate 32 of the source follower transistor 33 in the 3T pixel circuitry.

Figure 4:
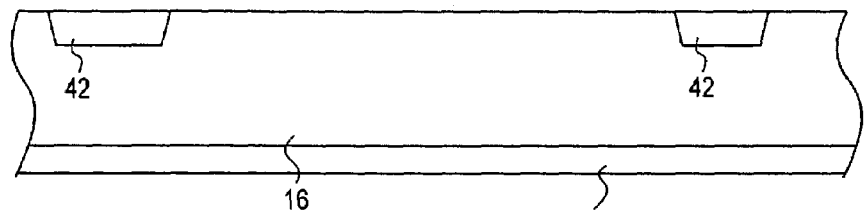
FIG. 4 illustrates a cut away side view of a pixel-containing portion of a semiconductor CMOS imager wafer in an initial stage of processing according to an exemplary embodiment of the invention.

FIGS. 4–11 illustrate more completely one exemplary pixel fabrication method for an exemplary imager featuring 4T pixel 12. Referring initially to FIG. 4, a preliminary stage of fabrication involves development of enhancement regions in the p-type EPI layer 16 provided over a p-type substrate 17. The trench isolation regions 42, for example, are formed within the layer 16 and surround active regions of pixel 12. The trench isolation regions 14 preferably are shallow trench isolation (STI) regions, but may also be formed without limitation by local oxidation of silicon (LOCOS) processing, for example. The trench isolation regions 42 are formed using a photoresist mask, patterning, and etching to leave trench isolation regions 42 where desired. The photoresist is removed, and a layer of dielectric material (e.g., silicon dioxide, silicon nitride, oxide-nitride, nitride-oxide, oxide-nitride-oxide, etc.) is formed within the trenches by CVD (chemical vapor deposition), LPCVD (low pressure CVD), HDP (high-density plasma), or other suitable means. After filling the trenches with the dielectric material, the wafer is planarized by chemical-mechanical polishing (CMP) or reactive ion etch (RIE) dry etching processes, for example.

Figure 5:
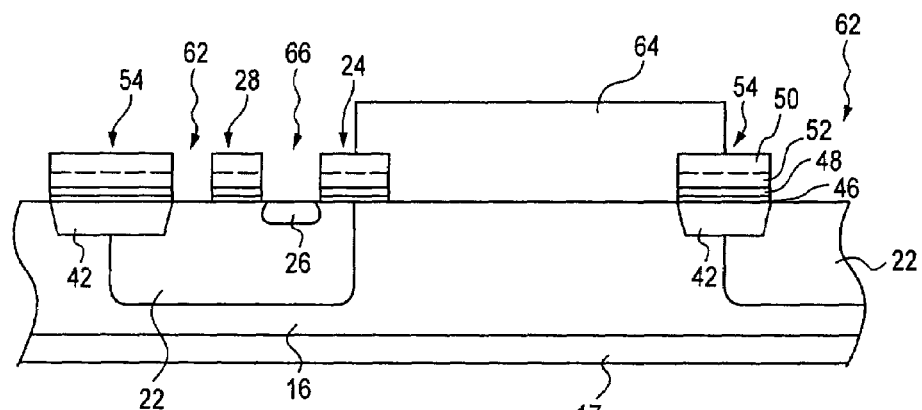
FIG. 5 illustrates a cut away side view of a portion of the exemplary semiconductor CMOS imager wafer at a processing stage subsequent to FIG. 4.

Referring to FIG. 5, the transfer gate 24, the reset gate 28, the source follower gate 32, and the row select gate 34 are formed. (Only gates 24 and 28 are shown in FIG. 5.) Standard MOS gates typically are provided by forming a gate oxide layer 46 (e.g., silicon oxide) over the layer 16, then forming a polysilicon layer 48 over the gate oxide layer 46. The polysilicon layer can be undoped, doped in situ, or subsequently implanted with a dopant, for example. Next, an insulative cap layer 50 (e.g., TEOS, Si(OC$_2$H$_5$)$_4$, oxide, or nitride) is formed. Subsequently, the layers 46, 48, 50 are masked, such as with patterned photoresist, and removed from underlying active areas by etching, leaving gate stacks which will be the transistor gates, including the transfer gate 24 and the reset gate 28. According to the exemplary embodiment of the invention, the photoresist patterning and etching is used to preserve the conserved areas 54, of which portions located over trench isolation regions 42 appear in FIG. 5.

In an alternative embodiment, a silicide layer 52 (shown by a dashed line in FIGS. 1 and 5–11) can be formed over the polysilicon layer 48. Additionally, a V$_t$ implant can be performed during processing, as is known in the art.

The p-well regions 22 are formed by a dopant implant 62 performed in the layer 16. The stacks for transfer gate 24 and reset gate 28 are formed along with the light shields of conserved sections 54. A photoresist mask 64 prevents the implant 62 from doping the area of the pixel where the photodiode 14 will later be formed. As an alternative, the p-type regions 22 may be formed by a blanket implant. Of course, dopant conductivity types utilized throughout processing can easily be reversed to form a PMOS type pixel structure, as opposed to the exemplary NMOS pixel shown and described.

After forming the p-well region 22, another implant 66 is used as is known in the art to form the n-type floating diffusion region 26 adjacent the stack for transfer gate 24. N-type source/drain regions for other transistors can be formed simultaneously. The floating diffusion region 26 acts as a source/drain region of the transfer transistor 25. Implant 66 can be performed in the implant dose range of about $1 \times 10^{12}$ to about $2 \times 10^{16}$ ions/cm$^2$. In a preferred embodiment the implant dose range for the implant 66 is about $4 \times 10^{12}$ to about $2 \times 10^{15}$ ions/cm$^2$ and the floating diffusion region 26 is completed by diffusion.

Figure 6:
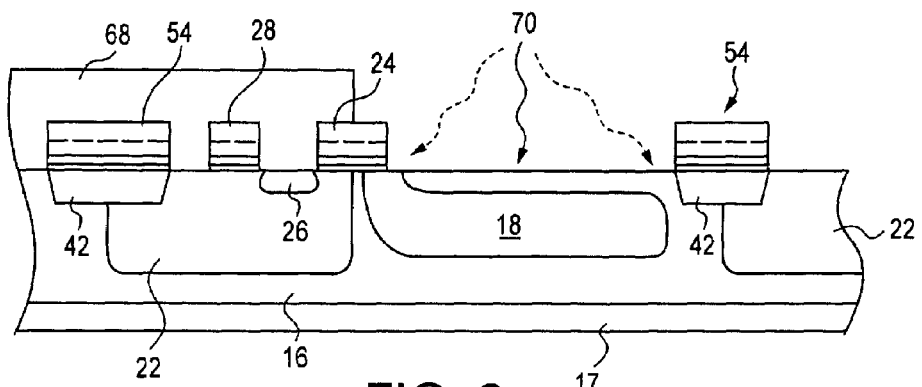
FIG. 6 illustrates a cut away side view of a portion of the exemplary semiconductor CMOS imager wafer at a processing stage subsequent to FIG. 5.
Figure 7:
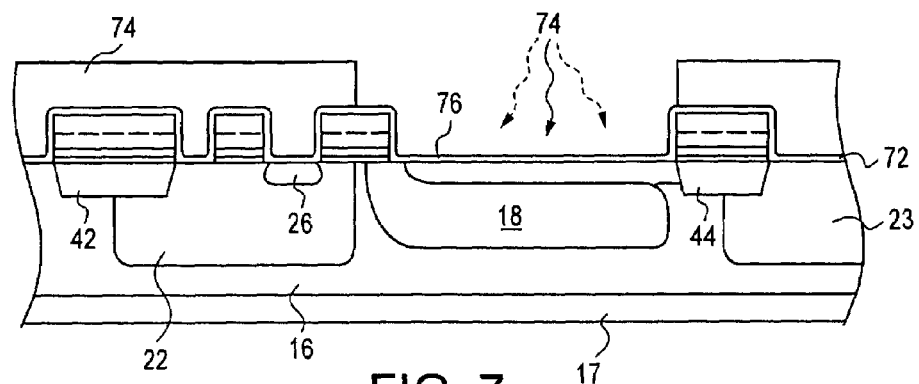
FIG. 7 illustrates a cut away side view of a portion of the exemplary semiconductor CMOS imager wafer in an interim stage of processing subsequent to FIG. 6.

The layers of the photodiode 14 (i.e., layers 18, 20, 21) can be formed as shown in FIGS. 6 and 7. The exemplary photodiode 14 comprises a p-n-p structure made of the underlying p-type layer 16, an n-type region 18 within the p-type layer 16, and a p-type layer 20 above the n-type region 18. FIG. 6 shows the layer 16 masked with a patterned photoresist 68, and another ion implantation 70 of a second conductivity type (n-type), is performed. This forms the n-type region 18 in the direct light receiving area of photodiode 14 and below the transfer gate 24. An angled ion implantation 70 can be utilized in forming the n-type region 18 to achieve certain spatial characteristics of the photodiode 14.

As shown in FIG. 7, after removing the patterned photoresist 68, an insulating layer 72 is formed. Another mask of photoresist 74 is supplied partially over the transfer gate 24 and a dopant implant 75 is carried out to form the top p-type layer 21 of the photodiode 14. Optionally, an angled implant for dopant implant 75 may be utilized. The photodiode 14 is termed a "pinned" photodiode because the potential in the photodiode 14 is pinned to a constant value when fully depleted.

Figure 8:
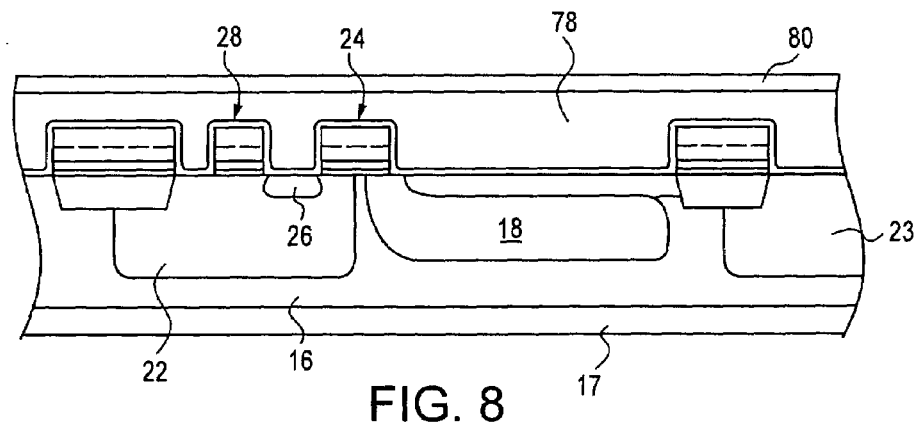
FIG. 8 illustrates a cut away side view of a portion of the exemplary semiconductor CMOS imager wafer at a processing stage subsequent to FIG. 7.

As shown in FIG. 8, a dielectric layer 78 deposited over the pixel 12 circuitry including the transfer gate 24 and reset gate 28. This dielectric layer 78 should be optically transparent so as not to impede light from reaching the photodiode 14. The dielectric layer 78 can comprise, e.g., silicon oxides or nitrides, glasses, or polymeric materials, and can be deposited by evaporative techniques, CVD (chemical vapor deposition), PECVD (plasma enhanced CVD), sputtering, or other techniques known in the art.

The dielectric layer 78 may be planarized by various techniques, such as CMP or RIE etching. Advantageously, however, the expanded coverage of the polysilicon layer 48 resulting from preservation of the conserved sections 54 will result in a more planar deposition of dielectric layer 78. Consequently, steps that were used prior to the invention for planarizing the dielectric layer 78 can be eliminated or abbreviated. Alternatively, if a conformal dielectric layer is desired, the planarization step is excluded.

Although sufficient light-shielding can be provided by the polysilicon layer 48 remaining in the conserved sections 54, a further optional upper layer light shield 80 can be formed over the dielectric layer 78 by depositing a layer of opaque or nearly opaque material as a thin film. The upper layer light shield 80 preferably is about 100 Å to about 3,000 Å thick. Upper layer light shield 80 can be made thinner than otherwise would be the case due to the presence of the conserved sections 54 performing as light shields. The upper layer light shield 80 should be of a thickness and material so that, combined with the light absorption of polysilicon layer 48, for example, a transmission rate of less than 1% of impacting light is achieved. Material for the upper level light shield 80 can comprise, e.g., tungsten (W), tungsten silicides (WSi$_x$), poly/WSi$_x$, titanium (Ti), titanium nitride (TiN), cobalt (Co), chromium (Cr), aluminum (Al), Ti/Al, TiSi$_2$/Al, and Ti/Al/TiN, without limitation. The light shield 80 can be deposited on the dielectric layer 78 by conventional methods, such as by evaporation techniques, physical deposition, sputtering, CVD, etc., as either a planar layer or a conformal layer. The light shield 80 can be electrically conductive or electrically insulative. If formed of a conductive material, the light shield 80 can be connected to ground, thereby offering an electrical shield to isolate the underlying circuitry from the overlying conductive interconnect, e.g., metallization layers, which will be formed in subsequent steps. Alternatively, the conductive light shield 80 can be used as an M1 layer to electrically connect areas of the pixel. The light shield 80 is positioned adjacent the underlying photodiode, and comparatively much closer to the photodiode than in prior art light shields formed in the M1 and/or M2 metallization layers. This, combined with the light shielding properties of conserved sections 54, also mitigates light piping and shadowing.

Figure 9:
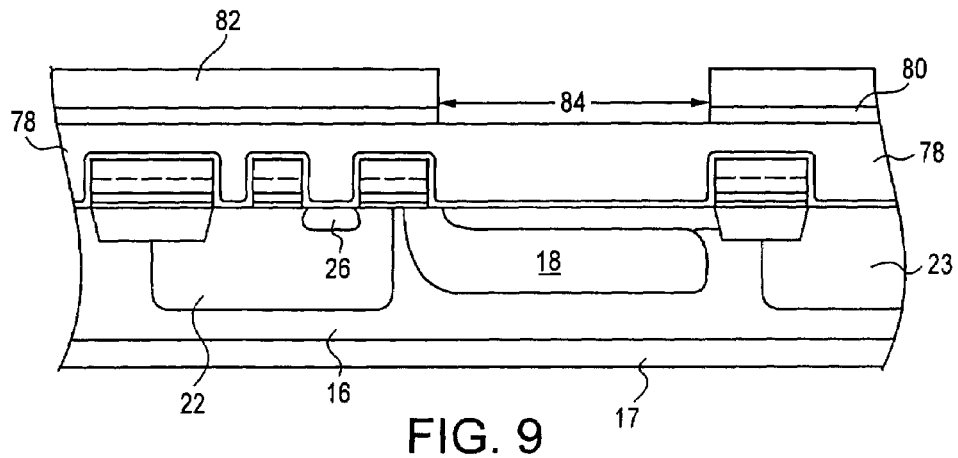
FIG. 9 illustrates a cut away side view of a portion of the exemplary semiconductor CMOS imager wafer at a processing stage subsequent to FIG. 8.

Next, as shown in FIG. 9, a patterned photoresist mask 82 is formed on the optional light shield 80. Subsequently, the optional light shield 80 is etched to form an aperture 84 over the photodiode 14. The dielectric layer 78 can serve as an etchstop.

Figure 10:
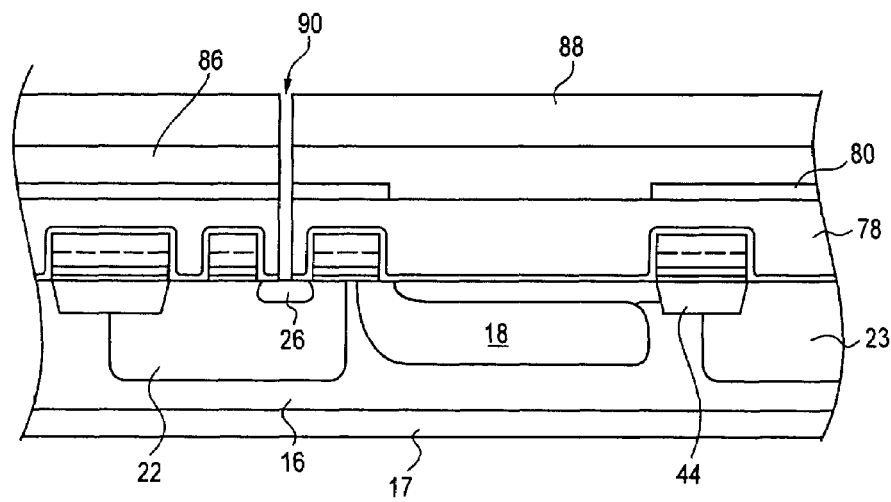
FIG. 10 is a partially cut away side view of a portion of the exemplary semiconductor CMOS imager wafer at a processing stage subsequent to FIG. 9.

As shown in FIG. 10, a second dielectric layer 86 is deposited over the optional light shield 80 and within the aperture 84 over the first dielectric layer 78. The second dielectric layer 86 can be the same or similar in compositional, light transmission, and dielectric properties as the first dielectric layer 78 and can be deposited in a similar fashion. The second dielectric layer 86 can be planarized by CMP or RIE etching techniques, or alternatively, can be a conformal layer. A patterned photoresist 88 is formed over the second dielectric layer 86. Subsequent etching forms opening 90, for example, through the two dielectric layers 78, 86 and the light shield 80, exposing gates and active areas in the substrate, such as floating diffusion region 26. The openings provide access for making interconnections between elements of the pixel circuitry, to a supply voltage, and to output and control circuits.

Figure 11:
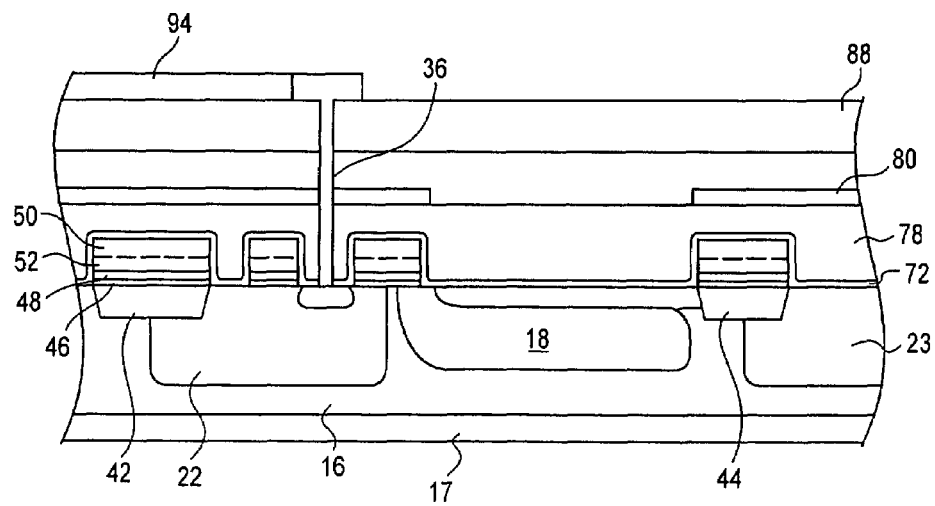
FIG. 11 illustrates a partially cut away side view of a portion of the exemplary semiconductor CMOS imager wafer at a processing stage subsequent to FIG. 10.

Conductors for active circuit areas of the pixel 12, for example, are formed within openings such as opening 90, shown in FIG. 11. Optionally, a thin insulating layer (not shown) can be deposited within the openings 90 to electrically isolate the optional light shield 80, if conductive, from the conductors. One such conductor 36 is shown to connect with the floating diffusion region 26. Over the second dielectric layer 86 and in electrical communication with the conductor 36, an interconnect layer 94, preferably of metal, is deposited to form an M2 layer. Generally, the conductive interconnect layer 94 should not extend over the aperture 90, or photodiode 14, for example, particularly if the conductive interconnect layer is composed of an opaque or translucent material. However, transparent or semi-transparent materials, e.g., polysilicon, can be used for the conductive interconnect layer 94, and can overlie the photodiode 14, if desired.

The floating diffusion region 26 is electrically connected with the source follower gate 32 through standard metallization steps, e.g., a conductor 36 connects to the floating diffusion region 26 and the second conductor 38 (see FIG. 3) connects to the source follower gate 32, between which is formed a conductive interconnect layer 94. Conductor 36 is in electrical communication with the M2 conductive interconnect layer 94 and thereby with the source follower gate 32 and the rest of the integrated circuit, of which the photodiode 14 is a part for supplying transduced charge to the pixel switching circuitry. Additional processing can follow, such as formation of an overlying dielectric layer 96 and a third conductive interconnect layer 98 (M3), as known in the art. It should be understood that FIGS. 10 and 11 only show one conductive via as exemplary. Other vias as needed for operation of the pixel are similarly formed.

By retaining the conserved sections 54 as light shields, and optionally providing upper light shields 80, the third conductive metal interconnect layer 98 (M3) for the pixel array can be made optional. Conductive metal interconnect layer 98 was one layer previously employed for light shielding. However, the M3 layer is optional. Eliminating the M3 layer reduces device size, complexity and cost, and reduces the number of necessary processing steps.

Additional features of the pixel structure fabricated after the FIG. 11 steps include passivation layers 100, 102, color filter array 104, polyimide layer 106, and lens array 108, for example, as shown in FIG. 1.

The polysilicon layer 48 used to form gate structures in the embodiments discussed above may also sometimes be used to provide buried pixel interconnect structures. In such case the conserved sections are portions of the polysilicon layer 48 not used for gates or interconnects.

Figure 12:
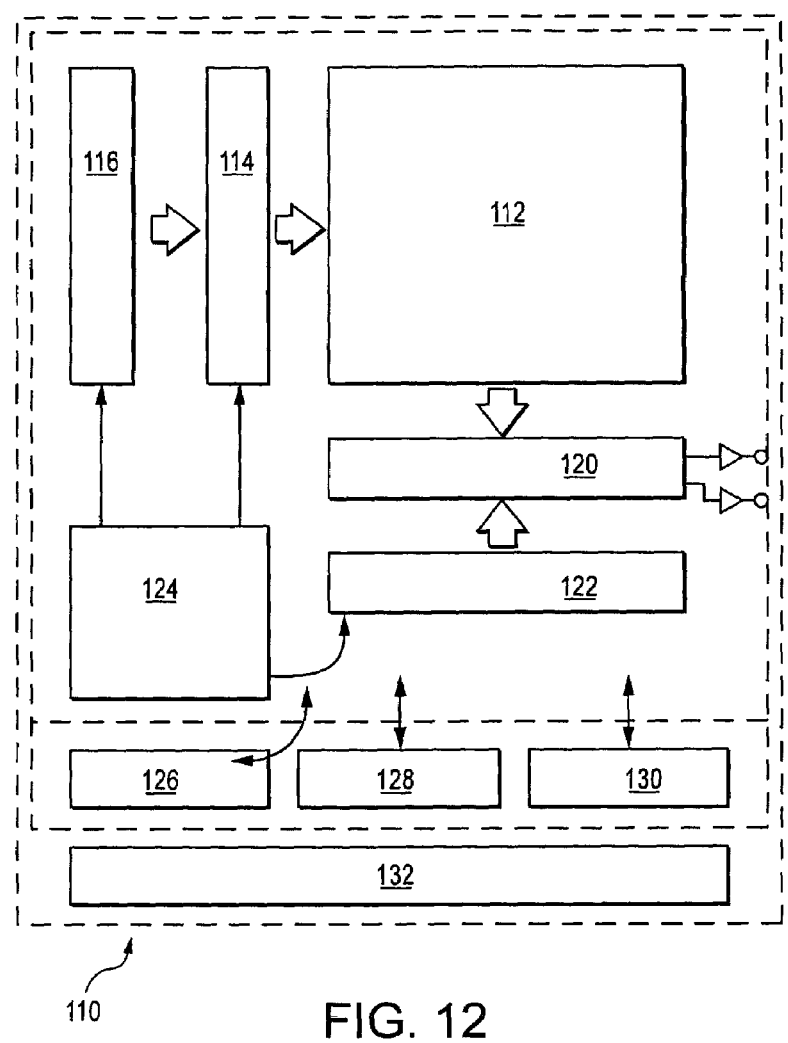
FIG. 12 is a block diagram of an exemplary imaging device including an array of imager pixels as illustrated in FIGS. 1–11.

FIG. 12 illustrates a block diagram for a CMOS imaging device 110 having a pixel array 112 incorporating pixels 12, 13, etc., constructed in the manner discussed above in relation to FIGS. 1–11. Pixel array 112 features a plurality of pixels arranged in columns and rows. The pixels of each row in pixel array 112 can all be turned on at the same time by a row select line and the pixels of each column are selectively output by a column select line. A plurality of row and column lines is provided for the entire pixel array 112. The row lines are selectively activated by a row driver 114 in response to a row address decoder 116 and the column select lines are selectively activated by a column driver 120 in response to a column address decoder 122. Thus, a row and column address is provided for each pixel.

The CMOS imaging device 110 is operated by a control circuit 124 which controls the address decoders 116, 122 for selecting the appropriate row and column lines for pixel readout, and the row and column driver circuits 114, 120 which apply driving voltage to the drive transistors of the selected row and column lines. A memory 126, e.g., a FLASH memory or an SRAM, can be in communication with the pixel array 112 and control circuit 124. A serializer module 128 and SFR (Special Function Register) device 130 can each be in communication with the control circuit 124. Optionally, a localized power source 132 can be incorporated into the imaging device 110.

Typically, the signal flow in the imaging device 110 would begin at the pixel array 112 upon its receiving photo-input and generating a charge. The signal is output to a read-out circuit and then to an analog-to-digital conversion device. The digitized signal is transferred to a processor, then the serializer, and the serialized signal can be output from the imaging device to external hardware.

Figure 13:
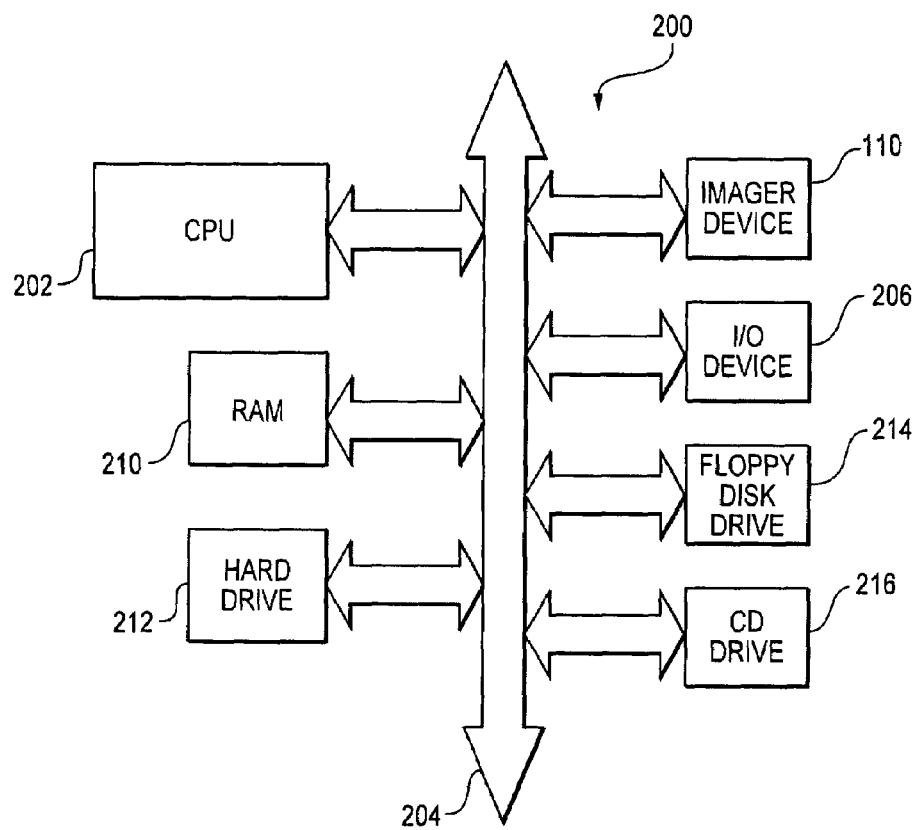
FIG. 13 illustrates a processing system including a CMOS imager according to an exemplary embodiment of the present invention.

FIG. 13 shows system 200, a typical processor based system, which includes an imaging device 110 illustrated in FIG. 12 as an input device to the system 200. The imaging device 110 may also receive control or other data from system 200 as well. Examples of processor based systems, which may employ the imaging device 110, include, without limitation, computer systems, camera systems, scanners, machine vision systems, vehicle navigation systems, video telephones, surveillance systems, auto focus systems, star tracker systems, motion detection systems, image stabilization systems, and others.

System 200 includes a central processing unit (CPU) 202 that communicates with various devices over a bus 204. Some of the devices connected to the bus 204 provide communication into and out of the system 200, illustratively including an input/output (I/O) device 206 and imaging device 110. Other devices connected to the bus 204 provide memory, illustratively including a random access memory (RAM) 210, a hard drive 212, and one or more removable memory devices, such as a floppy disk drive 214, compact disk (CD) or digital video disk (DVD) drives 216, flash memory cards, etc. The imaging device 110 may be combined with a processor, such as a CPU, digital signal processor, or microprocessor, in a single integrated circuit.

The processes and devices described above illustrate exemplary methods and devices out of many that could be used and produced according to the present invention. The above description and drawings illustrate exemplary embodiments which achieve the objects, features, and advantages of the present invention. It is not intended, however, that the present invention be strictly limited to the above-described and illustrated embodiments. For example, the invention is not limited to the use of a gate polysilicon or oxide layer as a light shield. As noted, the conserved sections of these layers may also be used to gather light.

Figure 14:
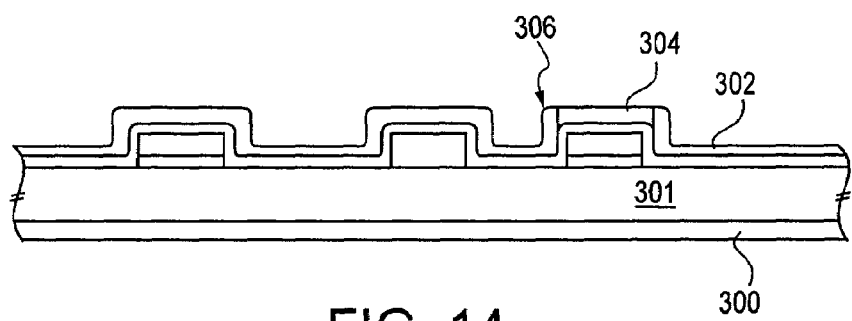
FIG. 14 illustrates another exemplary embodiment of the invention in which sections of a layer used to form a top cell plate of a capacitor are conserved for light shielding or collecting purposes.

Referring now to FIG. 14, substrate 300 and fabrication layer 301 (shown generically) support polysilicon layer 302 used for a top electrode plate 304 of a capacitor 306, for example. Polysilicon layer 302 also could be patterned to produce conserved sections used as light shields or for light gathering, in addition to, or separate from, the polysilicon gate layer conserved sections. Accordingly, modifications, though presently unforeseeable, of the present invention that come within the spirit and scope of the following claims should be considered part of the present invention.

What is claimed as new and desired to be protected by Letters Patent of the United States is:

1. A method of forming a pixel of an imaging device, comprising:
   forming a photodiode supported by a substrate;
   forming a first layer on the substrate covering the photodiode; and
   patterning the first layer to remove said first layer from over the photodiode and to provide a first section comprising circuitry arranged to operate the pixel, and a second non-electrical section for blocking light.

2. A method as in claim 1, wherein the step of patterning the first layer to provide a first section comprises fabricating gates for operating the pixel.

3. A method as in claim 2, further comprising forming a second layer adjacent the first layer and patterning the first layer and the second layer simultaneously.

4. A method as in claim 1, further comprising fabricating an electrode of a capacitor from a first section of a third layer, and patterning a second section of the third layer to be electrically isolated from the first section.

5. A method of forming a CMOS imager pixel array, comprising:
   arranging a plurality of CMOS imager pixels in rows and columns on a substrate, the CMOS imager pixels each being formed by steps comprising:
   providing a photodiode supported by the substrate; and
   forming a conductive layer supported by the substrate, a first portion of the conductive layer comprising gate structures connected in a circuit to operate the photodiode, and a second portion of the conductive layer being passive and electrically isolated from operating the photodiode.

6. A method as in claim 5, wherein the step of forming the conductive layer comprises patterning the conductive later to provide the first portion and the second portion.

7. A method as in claim 5, further comprising patterning an insulating layer in correspondence with and adjacent the conductive layer.

* * * * *

UNITED STATES PATENT AND TRADEMARK OFFICE
CERTIFICATE OF CORRECTION

| | | |
|---|---|---|
| PATENT NO. | : 7,202,098 B2 | Page 1 of 1 |
| APPLICATION NO. | : 11/439965 | |
| DATED | : April 10, 2007 | |
| INVENTOR(S) | : Bryan G. Cole | |

It is certified that error appears in the above-identified patent and that said Letters Patent is hereby corrected as shown below:

In the Specification, the following error is corrected:

Column 8, line 61, "a" should read --α--.

In Claim 6, the following error is corrected:

Column 14, line 44, "later" should read --layer--.

Signed and Sealed this

Twenty-sixth Day of June, 2007

JON W. DUDAS
*Director of the United States Patent and Trademark Office*